United States Patent
Shim et al.

(10) Patent No.: US 7,611,644 B2
(45) Date of Patent: Nov. 3, 2009

(54) CORE-SHELL STRUCTURE METAL NANOPARTICLES AND ITS MANUFACTURING METHOD

(75) Inventors: In-Keun Shim, Seoul (KR); Young-Soo Oh, Seongnam-si (KR); Jae-Woo Joung, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 292 days.

(21) Appl. No.: 11/709,242

(22) Filed: Feb. 22, 2007

(65) Prior Publication Data

US 2007/0212562 A1  Sep. 13, 2007

(30) Foreign Application Priority Data

Feb. 24, 2006  (KR)  ............... 10-2006-0018250

(51) Int. Cl.
*H01B 1/00* (2006.01)
*H01B 1/22* (2006.01)
*B01J 13/02* (2006.01)

(52) U.S. Cl. ............... 252/500; 252/512; 252/514; 427/213.3

(58) Field of Classification Search ........... 252/500, 252/512, 514; 427/213.3
See application file for complete search history.

(56) References Cited

FOREIGN PATENT DOCUMENTS

| CN | 1049675 A | 3/1991 |
|----|-----------|--------|
| CN | 1129339 A | 8/1996 |
| KR | 2003-0015593 | 2/2003 |
| KR | 1020030015593 | * 2/2003 |

OTHER PUBLICATIONS

Notice of Preliminary Rejection, dated Jan. 25, 2007, of the Korean Intellectual Property Office (KIPO).
Liu Zhijie et al., "Preparation of Ultrafine Core-Shell Cu0Ag Bimetallic Powers", Journal of Norganic Chemistry, 12, 30-34, Mar. 1993.
Chinese Office Action issued on May 22, 2009 in corresponding Korean Patent Application No. 200710079515.

* cited by examiner

*Primary Examiner*—Mark Kopec
*Assistant Examiner*—Jaison P Thomas

(57) ABSTRACT

The present invention provides metal nanoparticles, containing copper core and thin layer of precious metals enclosing the core to prevent oxidization of copper, in which manufacturing the metal nanoparticles is economical efficiency because of increased copper content and since such metal nanoparticles contain a metal having high electrical conductivity such as silver for a thin layer, they can form a wiring having better conductivity than copper and there is little concern that silver migration may occur.

22 Claims, 6 Drawing Sheets

CORE-SHELL STRUCTURE METAL NANOPARTICLES AND ITS MANUFACTURING METHOD

CROSS-REFERENCE TO RELATED APPLICATIONS

This application claims the benefit of Korean Patent Application No. 10-2006-0018250 filed on Feb. 24, 2006, with the Korea Intellectual Property Office, the contents of which are incorporated here by reference in their entirety.

BACKGROUND

1. Technical Field

The present invention relates to a method of producing metal nanoparticles and the metal nanoparticles thus produced, and in particular, to metal nanoparticles of core-shell structure and its manufacturing method.

2. Description of the Related Art

General ways to produce metal nanoparticles are the vapor-phase method, the solution (colloid) method and a method using supercritical fluids. Among these methods, the vapor-phase method using plasma or gas evaporation is generally capable of producing metal nanoparticles with the size of several tens of nm, but has limitation in synthesizing small-sized metal nanoparticles of 30 nm or less. Also, the vapor-phase method has shortcomings in terms of solvent selection and costs, particularly, in that it requires highly expensive equipments.

The solution method including thermal reduction and phase transfer is capable of adjusting various sizes of metal nanoparticles, synthesizing several nm sizes of metal nanoparticles having uniform shape and distribution. However, the production of metal nanoparticles by this existing method provides very low yield rate, as it is limited by the concentration of the metal compound solution. That is, it is possible to form metal nanoparticles of uniform size only when the concentration of the metal compound is less than or equal to 0.01M. Thus, there is a limit also on the yield of metal nanoparticles, and to obtain metal nanoparticles of uniform size in quantities of several grams, chemical reactor of 1000 liters or more is needed. This represents a limitation to efficient mass production. Moreover, the phase transfer method necessarily requires a phase transfer, which is a cause of increased production costs.

In case of forming fine wirings with these metal nanoparticles, precious metals such as gold, silver, palladium, platinum are preferable with respect to conductivity. However, since these metals are expensive and cause increase of production cost of electronic devices, the use of copper which has desired conductivity and economical efficiency is needed. However, if copper is used to produce nanoparticles, it is oxidized easily and an oxidized layer is formed on the surface so that the conductivity decreases rapidly. Therefore, in spite of increase of production cost, precious metals such as silver are used to produce a fine wiring.

Moreover, in case of forming wirings with silver, since metal nanoparticles gather together to the margin area in a wiring unit or in droplets of conductive ink which will form the wiring, the migration that metal is precipitated at a cathode according to ionization of metals, may easily occur. Therefore, there is a risk that may cause potential inferiority even after formation of wiring, actually the inferiority caused by the migration of silver incurs the inferiority of entire goods.

SUMMARY

The present invention provides metal nanoparticles, containing a copper as a core and a thin layer of a precious metal enclosing the core to prevent oxidization of copper and provide economical efficiency because of increased copper content. Since such metal nanoparticles contain a metal having high electrical conductivity such as silver for a thin layer, they can form a wiring having better conductivity than copper and there is little concern that the metal migration may occur. The present invention also provides conductive ink containing these metal nanoparticles.

The invention provides a method of producing metal nanoparticles having an copper core-precious metal shell structure that have not been obtained so far, by decreasing reduction potential difference between copper and precious metals, using a reducing agent.

Further, the present invention provides a method of manufacturing metal nanoparticles economically in a liquefied condition, which does not require complicated facilities, rigorous conditions, and harsh air condition.

One aspect of the invention may provide metal nanoparticles containing a copper core and a metal thin layer that encloses the copper core and has higher reduction potential than copper.

Here, the metal having higher reduction potential than copper may include one or more metals selected from a group consisting of silver, palladium, platinum, gold and alloys thereof. A diameter may be 50-100 nm and a thickness of the metal thin layer may be 1-50 nm. Such a metal thin layer prevents copper in the metal nanoparticles from oxidation.

Another aspect of the invention may provide a method of manufacturing metal nanoparticles including forming copper nanoparticles from a copper precursor using a reducing agent in a solution that includes a primary amine, and forming a metal thin layer from a metal precursor having high reduction potential than copper on the copper nanoparticles.

According to an embodiment, a method of manufacturing the metal nanoparticles includes: mixing a copper precursor and a reducing agent uniformly in a solvent containing a primary amine; forming copper core nanoparticles by heating the mixture up to the boiling temperature of the solvent or lower; cooling the mixture to room temperature or below the heated temperature; adding a metal alkanoate having higher reducing potential than copper; and forming a metal thin layer on the surface of the copper core nanoparticles by heating the mixture up to the boiling temperature of the solvent or lower.

Here, the primary amine may be one or more compounds selected from the group consisting of propylamine, butylamine, octylamine, decylamine, dodecylamine, hexadecylamine and oleylamine.

Here, the solvent may further include hydrocarbon-based compounds, according to an embodiment, the hydrocarbon-based compound may be one or more compounds selected from the group consisting of octane, decane, tetradecane, hexadecane, toluene, xylene, 1-octadecene and 1-hexadecene, which may be added by 50-200 parts by weight with respect to 100 parts by weight of the primary amine.

Further, the reducing agent may be one or more compounds selected from the group consisting of tert-butylhydroxytoluene, tert-butylhydroxyanisol, α-tocopherol, ascorbic acid, carotenoid, flabonoid and tannin, which may be added by 1-20 parts by weight with respect to 100 parts by weight of the solvent.

Here, the copper precursor may be one or more compounds selected from the group consisting of $Cu(NO_3)_2$, $CuCl_2$, $Cu(HCOO)_2$, $Cu(CH_3COO)_2$, $Cu(CH_3CH_2COO)_2$, $CuCO_3$, $CuSO_4$ and $C_5H_7CuO_2$, which may be added by 1-15 parts by weight with respect to 100 parts by weight of the solvent.

Here, the metal having higher reduction potential than copper may be one or more metals selected from the group consisting of silver, palladium, platinum, gold and alloys thereof, preferably silver.

Here, the metal alkanoate having higher reduction potential than copper may be one or more compounds selected from the group consisting of dodecanate, oleate, hexadecanoate, tetradecanoate, palmitate and stearate of silver, palladium, platinum, gold, and its alloy, which may be added so that the metal ions supplied by the metal alkanoate becomes 0.01-1 equivalent of the copper ions supplied by the copper precursor.

The mixture of the copper precursor and the reducing agent is mixed uniformly at 50-80° C. for 30 minuties to 2 hours.

Also, a temperature of the mixture may be raised by a constant rate up to the boiling temperature of the solvent or lower. According to an embodiment, the temperature is in ther range of from 100 to 32020 C., the constant rate is 1-10° C./min, both the mixture of the copper precursor and the reducing agent and the mixture of the copper nanoparticles and the metal alkanoate are reacted at 130-23020 C. for 30 minutes to 2 hours.

The mixture of the copper precursor and the reducing agent is cooled to 70% of the heated temperature or lower, according to an embodiment, the mixture is cooled to 18-17520 C.

Here, the method may further include precipitating the mixture including metal nanoparticles from an organic solvent, and washing the precipitated nanoparticles with the organic solvent and drying.

According to another aspect of the invention, the invention may provide core-shell structure nanoparticles produced by the producing method described above.

Here, the core may be copper and the shell may be a layer composed of one or more metals selected from the group consisting of silver, palladium, platinum, gold and alloys thereof.

Another aspect of the invention may provide colloid including the core-shell structure nanoparticles.

Another aspect of the invention may provide conductive ink including the core-shell structure nanoparticles.

BRIEF DESCRIPTION OF THE DRAWINGS

These and/or other aspects and advantages of the present invention will become apparent and more readily appreciated from the following description of the embodiments, taken in conjunction with the accompanying drawings of which.

<Descriptions for major part of the figures>
3: nanoparticles
33: shell
31: core

DETAILED DESCRIPTION

Hereinafter, embodiments will be described referring to the figures in detail of the method of producing metal nanoparticles and the metal nanoparticles thus produced according to the present invention. Before describing the embodiments of the invention, reduction potential of metals will be mentioned first.

Reduction potential of metals represents a strength of the tendency that a metal receives electrons to be reduced. Higher reduction potential means that a metal cation receives electrons to be easily precipitated out as a metal. Reduction potential is contrary to ionization tendency, for example, $K<Ca<Na<Mg<Al<Mn<Zn<Cr<Fe<Co<Ni<Cu<Hg<Ag<Pd<Pt<Au$, in which reduction potential increases toward right side of the equation. In case of Cu and Ag, when $Ag^+$ ion is added to a dissociating solution where Cu is already precipitated, $Ag^+$ forces Cu to be dissolved and $Ag^+$ itself is reduced and becomes Ag, because reduction potential of Ag is higher than Cu. Therefore, Cu in the dissociating solution decreases and Ag increases. With this reason, so far it has been believed that metals having higher reduction potential than Cu, such as Ag, are not suitable for producing a shell structure enclosing Cu core after Cu is formed as a core.

Figure 1:
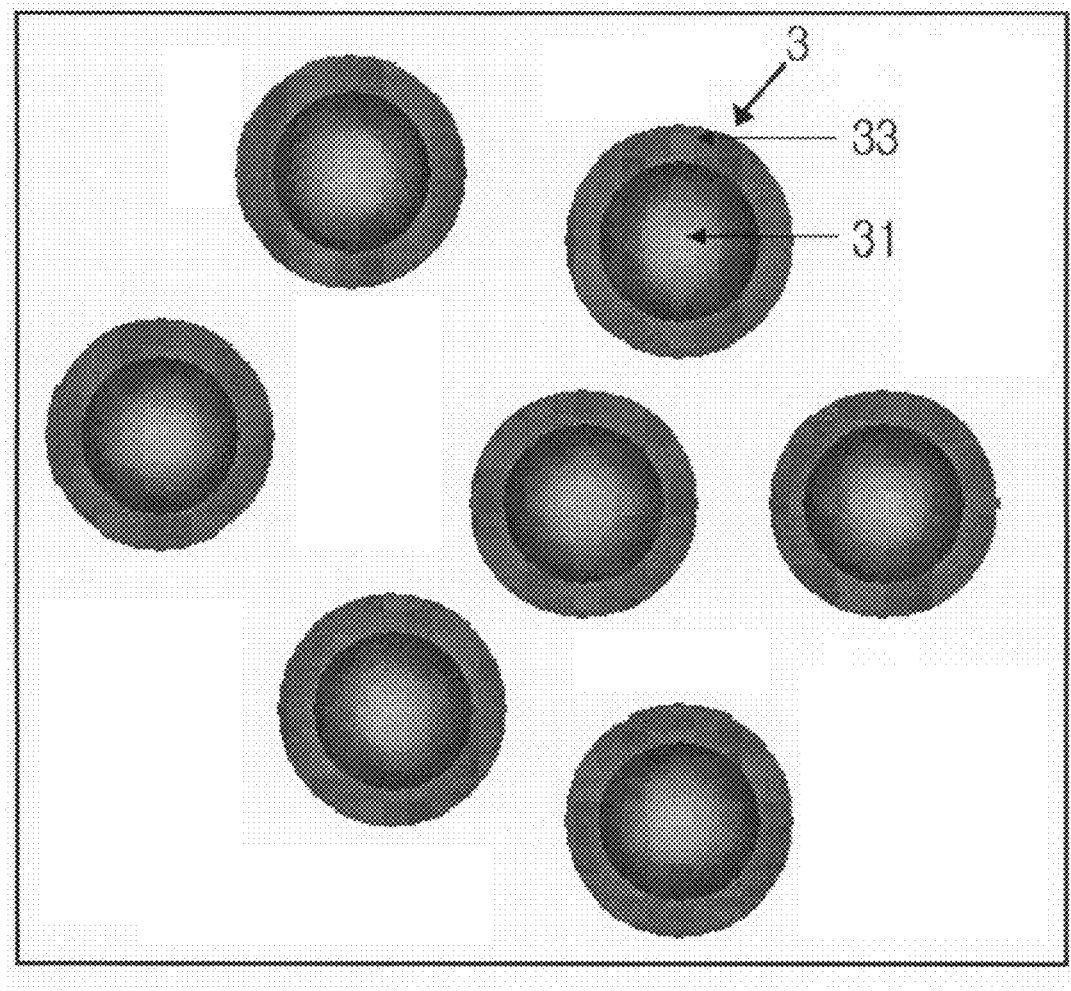
FIG. 1 is a sectional diagram of the metal nanoparticles produced according to an embodiment of the invention.

But, in the present invention, by using an appropriate reducing agent that decreases the difference in reduction potential between metals, nanoparticles of copper core-precious metal shell structure can be obtained. FIG. 1 is a sectional diagram of the metal nanoparticles produced according to an embodiment of the invention. Referring to FIG. 1, nanoparticles 3 of the invention have a dual structure of core 31 and shell 33. As the core 31 contains copper, nanoparticles that are economically efficient and resistant to the oxidation of copper can be produced. Further, since the shell 33, i.e. the surface, is enclosed with a precious metal having excellent electrical conductivity, metal nanoparticles that is also superior in electrical conductivity can be obtained. Secondarily, the migration of a precious metal such as silver to a cathode, resulting in accumulation and eventually precipitation at a cathode, can also be alleviated.

Besides silver, the shell 33 may include one or more metals selected from the group consisting of palladium, platinum, gold and alloys thereof. These are categorized as precious metals and so far have been known to having superior electrical conductivity. Also, since the reduction potential of them is higher than copper, it have been difficult to readily generate a thin layer on the copper core so far.

Metal nanoparticles produced according to an embodiment of the invention have 50-100 nm in diameter. A thickness of the metal thin layer, i.e., the shell, may vary with equivalents of ions of metals that are added, which may be 1-50 nm according to an embodiment of the invention.

Hereinafter, the method of producing these metal nanoparticles of the core-shell structure will be described in detail.

According to an embodiment of the invention, the method of producing metal nanoparticles includes formation of copper nanoparticles from a copper precursor using a reducing agent in a solvent that contains a primary amine, and formation of a metal thin layer produced from a metal precursor having higher reduction potential than copper, on the copper nanoparticles.

More specifically, the metal nanoparticles of the invention are produced by (a) mixing the copper precursor with the reducing agent uniformly in the solvent containing the primary amine, (b) forming nanoparticles of the copper core by heating the mixture of (a) up to below the boiling temperature of the solvent, (c) cooling to room temperature or below the raised temperature of (b), (d) adding a metal alkanoate having higher reducing potential than copper, (e) forming a metal thin layer on the surface of the copper core by heating the mixture of (d) up to below the boiling temperature of the solvent.

Because of very small size, metal nanoparticles tend to aggregate each other and readily grow to the size of microns, when reaction occurs rapidly, size controlling is important in producing metal nanoparticle. Therefore, in order to produce the metal particles in nano-size, capping molecule are required. Here, the capping molecule designate molecule that enclose metal particles to grow stably and to form nano-size in a solvent. These capping molecule may be known compounds, and compounds that have oxygen, nitrogen, and sulfur atoms are generally used as the capping molecule. More specifically, compounds that have thiol group(—SH), amine group(—$NH_2$), and carboxyl group(—COOH) may be used as capping molecule. In the invention, primary amines are selected as the solvent to use as capping molecules. These primary amines also function to dissociate a metal precursor, and more specifica example includes propylamine ($C_3H_7NH_2$), butylamine($C_4H_9NH_2$), octylamine ($C_8H_{17}NH_2$), decylamine($C_{10}H_{21}NH_2$), dodecylamine ($C_{12}H_{25}NH_2$), hexadecylamine($C_{16}H_{33}NH_2$), or oleylamine ($C_{18}H_{35}NH_2$). Here, butylamine, propylamine, hexadecylamine, and oleylamine are excellent in dissociating metals and can be used as proper solvents because of their high boiling temperature. Further, as the carbon tails of amines such as hexadecylamine and oleylamine get longer, it is more efficient to produce uniform particles.

Further, according to an embodiment, the solvent may further include a hydrocarbon-based compound of the non-aqueous system together with the primary amine. Using the non-aqueous solvent, it is possible to control heating conditions for producing metal nanoparticles, and to supply enough energy that is required for pyrolysis of a metal precursor.

The hydrocarbon-based compound may be octane, decane, tetradecane, hexadecane, toluene, xylene, 1-octadecene, or 1-hexadecene. To produce proper metal nanoparticles according to the invention, a mixed solution may be reacted at 100° C. or higher. Since the boiling point of toluene is 110.6° C., xylene 140° C., 1-hexadecene 274° C, 1-octadecene 320° C., these can be used as solvents. Among these, 1-octadecene can be used more preferably, since it has highest boiling point and most wide adjustable temperature range for pyrolysis.

The hydrocarbon-based compound may be added 50-200 parts by weight with respect to 100 parts by weight of the primary amine set forth above. Here, if the hydrocarbon-based compound is added less than 50 parts by weight, polyhedron shape of nanoparticles can be formed instead of sphere shape according to the reaction temperature and time. On the other hand, if it is more than 200 parts by weight, the formation of nanoparticles are not affected and thereby not efficient.

In order to produce metal nanoparticles, an anti-oxidant, i.e., a reducing agent for reducing copper ions is needed. According to an embodiment of the invention, tert-butylhydroxytoluene, tert-butylhydroxyanisol, α-tocopherol, ascorbic acid, carotenoid, flabonoid, or tannin may be used as the reducing agent. This reducing agent may be added by 1-20 parts by weight with respect to 100 parts by weight of the solvent which is a primary amine or a mixture of a primary amine and a hydrocarbon-based compound. If the reducing agent is added by less than 1 part by weight, copper particle may not be formed and it is inappropriate for preventing the oxidation of copper particles. On the other hand, if the reducing agent is added by more than 20 parts by weight, copper particles are generated so rapidly that it is difficult not only to control the particle size but to isolate the particles formed, which thereby is inappropriate.

According to an embodiment of the invention, the copper precursor may be $Cu(NO_3)_2$, $CuCl_2$, $Cu(HCOO)_2$, $Cu(CH_3COO)_2$, $Cu(CH_3CH_2COO)_2$, $CuCO_3$, $CuSO_4$, or $C_5H_7CuO_2$. Among these compounds, $Cu(NO_3)_2$ is preferable since it is easy to get and economical. The copper precursor may be added by 1-15 parts by weight with respect to 100 parts by weight of the solvent. If the copper precursor is added by less than 1 part by weight, the size of copper particles becomes unequal, and particles having large sized are generated, which is thereby not preferable.

Metals having higher reduction potential than copper may be silver, palladium, platinum or gold and considering conductivity and reduction potential, alloys of these metals may also be used. Among these, silver may be used preferably with respect to conductivity and reduction potential. The precursor including such a metal or a mixture may be alkanoate compounds, and any compound having $RCOO^-$ group that is convenient to generate complexes of metal alkanoate may be used without limitation, wherein, R may be a substituted or not substituted, saturated or not saturated hydrocarbon. According to an embodiment, preferably the carbon number of the alkanoate is 8-18. Examples of the metal alkanoate include dodecanate, oleate, hexadecanoate, tetradecanoate, or stearate compounds of silver, palladium, platinum, gold or alloys thereof.

For example, Ag-alkanoate can be obtained by reacting AgOH with an alkanoic acid having a variety of length, preferably 8-18 carbons, or an amine-based compound. Examples of the alkanoic acid include dodecanoic acid(lauric acid, $C_{11}H_{23}COOH$), oleic acid($C_{17}H_{33}COOH$), hexadecanoic acid(palmitic acid, $C_{15}H_{31}COOH$), tetradecanoic acid (myristic acid, $C_{13}H_{27}COOH$), stearic acid($C_{35}H_{69}COOH$), and the like which are used to produce Ag-alkanoate compounds.

The metal alkanoate such as alkanoates of silver, palladium, platinum, gold or alloys thereof having high reduction potential, may be added so that the metal ions supplied by this alkanoates become 0.01-1 equivalent of copper ions supplied by the copper precursor. Here, a thickness of the shell varies with equivalents of metal ions of the added metal alkanoate. If the equivalent of metal ions of the metal alkanoate is less than 0.01, it is not enough to enclose the copper core thoroughly and to prevent the oxidation of copper particles. On the other hand, if it is more than 1 equivalent, the particle size becomes so large that the yield rate inappropriately decreases.

More detailed descriptions for the production method of nanoparticles of the invention will be given below. It is preferable that, in the step of mixing the copper precursor and the reducing agent in the solvent including the primary amine, the copper precursor and the reducing agent are uniformly mixed with the primary amine or a mixture of the primary amine and the hydrocarbon-based compound, and stirred for a certain period at over room temperature to react sufficiently. To do this, it is preferable that the mixture be stirred at 50-80 20 C. for 30 minutes to 2 hours.

Further, in the step of forming copper core particles or the step of adding the metal alkanoate, temperature may be raised by a contant rate up to below the boiling temperature of the solvents. As mentioned earlier, because the boiling temperature of the solvent is in the range of from 100 to 320 20 C., it is raised within this range. If the temperature is lower than 100° C., the yield rate decreases, and if it is higher than 320° C., it exceeds the boiling temperature of the solvent, which is not appropriate.

Here, the temperature is raised by a constant rate of 1-10° C./min, which affects the uniformity of the reaction and the whole reaction time. If the rate is exceeded greater than 10° C./min, it is difficult to control the uniformity of particles. According to an embodiment, it is preferable that the step of forming copper core particles and the step of adding the metal alkanoate are performed at 130-230° C. for 30 minutes to 2 hours. If the reaction time is shorter than 30 minutes, the yield rate decreases, and if the reaction time is longer than 2 hours, the uniformity of particles decreases.

After forming copper nanoparticles, the reaction mixture is cooled down in order to form a precious metal thin layer that encloses the copper particles. This is for the alkanoate compound of the precious metal not to pyrolize rapidly and to grow to nano size, resulting in stably forming a precious metal thin layer. It is preferable that the cooling be performed within a short period of time. Air cooling is used in an embodiment of the invention. Here, the temperature is cooled to lower than the heated temperature, preferably 70% of the heated temperature or lower. According to an embodiment of the invention, it is cooled to 18-175° C.

The alkanoate compound of the precious metal is added and the temperature is raised as described previously to form a thin layer of precious metal nanoparticles around the copper core.

The method may further include precipitating the metal nanoparticles in an organic solvent, such as methanol, DMF or mixtures thereof, cleaning with an organic solvent, and drying. The method may further include obtaining the precipitated metal nanoparticles by centrifugation. The method of obtaining the produced metal nanoaprticles may be any typical one, which is not limited to the descriptions given above.

Figure 2:
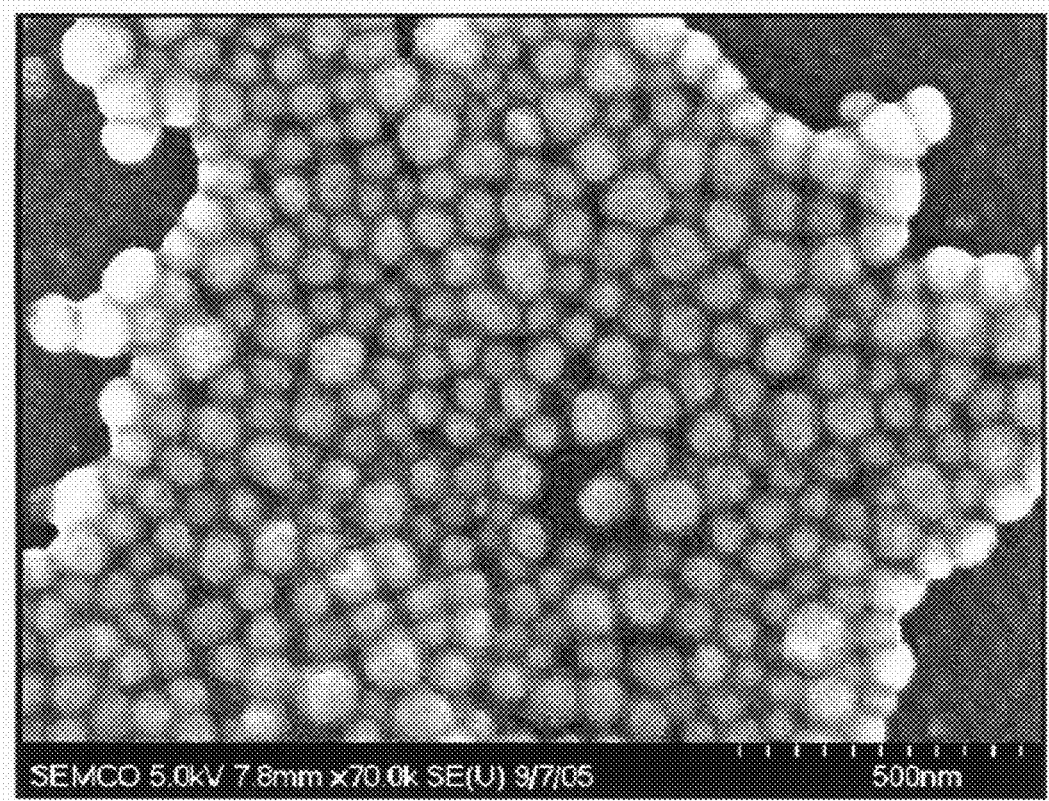
FIG. 2 is a SEM photo of the metal nanoparticles produced according to an embodiment of the invention.
Figure 3:
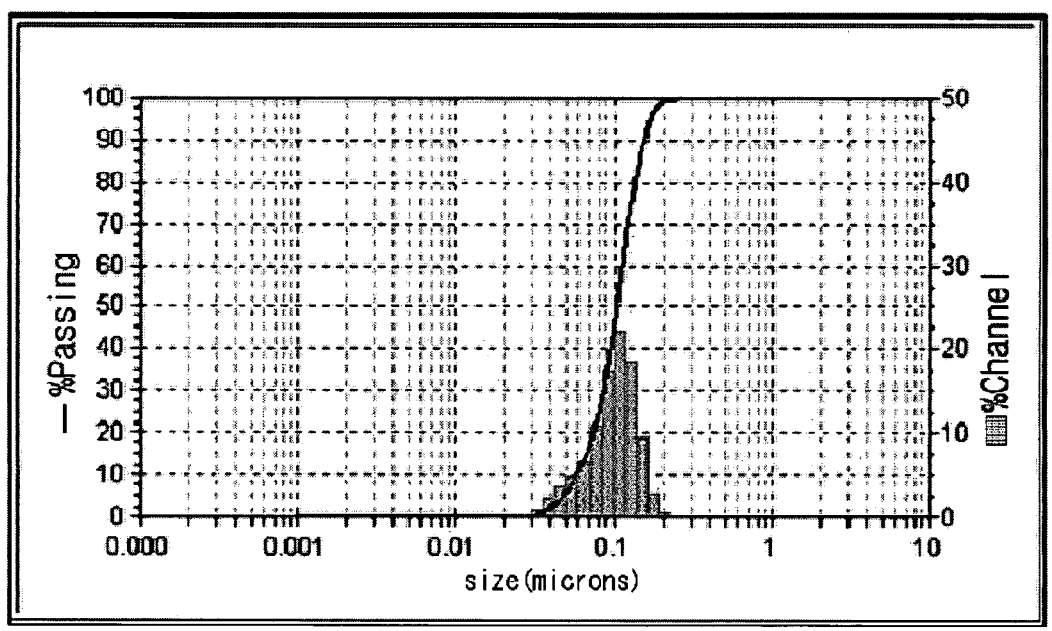
FIG. 3 is a graph of the distribution of the metal nanoparticles produced according to an embodiment of the invention.

FIG. 2 is a SEM photo of the metal nanoparticles produced according to an embodiment of the invention. Referring to FIG. 2, it is shown that 5-100 nm of uniform round shaped nanoparticles are produced. FIG. 3 is a graph representing particle distribution of the metal nanoparticles produced according to an embodiment of the invention. Referring to FIG. 3, the result shows that mean size of the produced particle is 100 nm.

FIG. 4(a) is a transmission electron microscope (TEM) photo and FIG. 4(b) is a graph representing the ratio of regional contents of the particle produced by an embodiment of the invention. FIG. 4(a) shows a profile of TEM-EDS line, which is Z-brightness of the metal nanoparticles of the invention. Referring to FIG. 4(a), difference in brightness between the core and the shell is obvious in the photo. Since the difference in brightness depends on the number of electrons of a metal that forms nanoparticles, it can be deduced that the core and the shell are composed of different kinds of metals. Further, referring to FIG. 4(b), the result of elements analysis by the TEM-EDS line profile confirms that the core of the nanoparticles is copper and the shell is silver.

Figure 5:
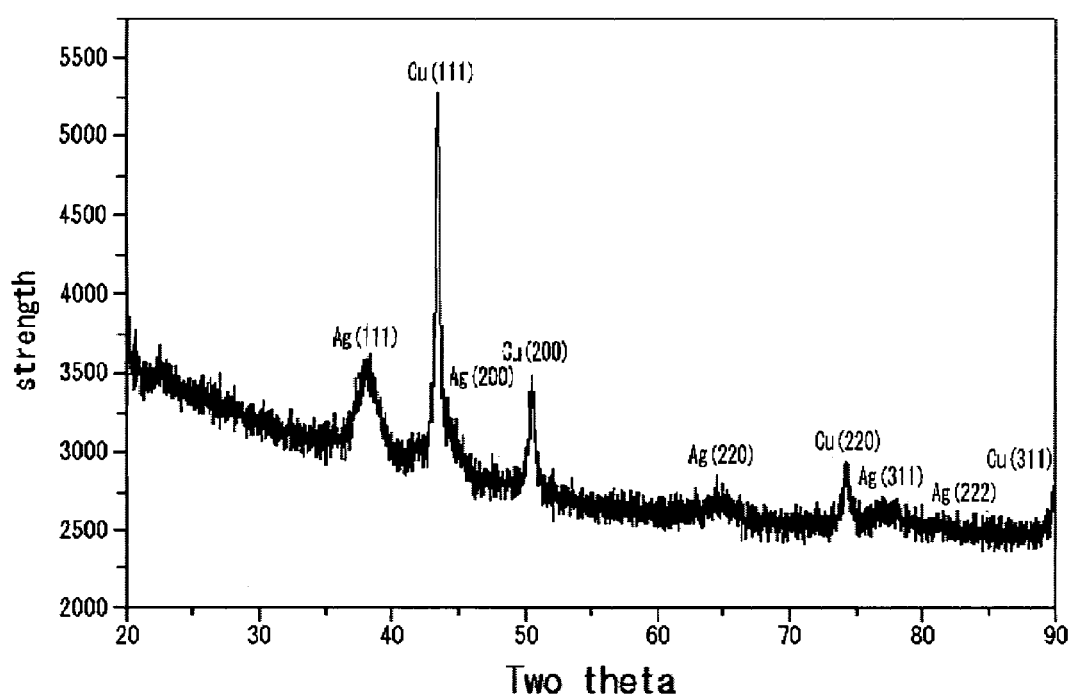
FIG. 5 is a XRD result of the metal nanoparticles produced according to an embodiment of the invention.
Figure 6:
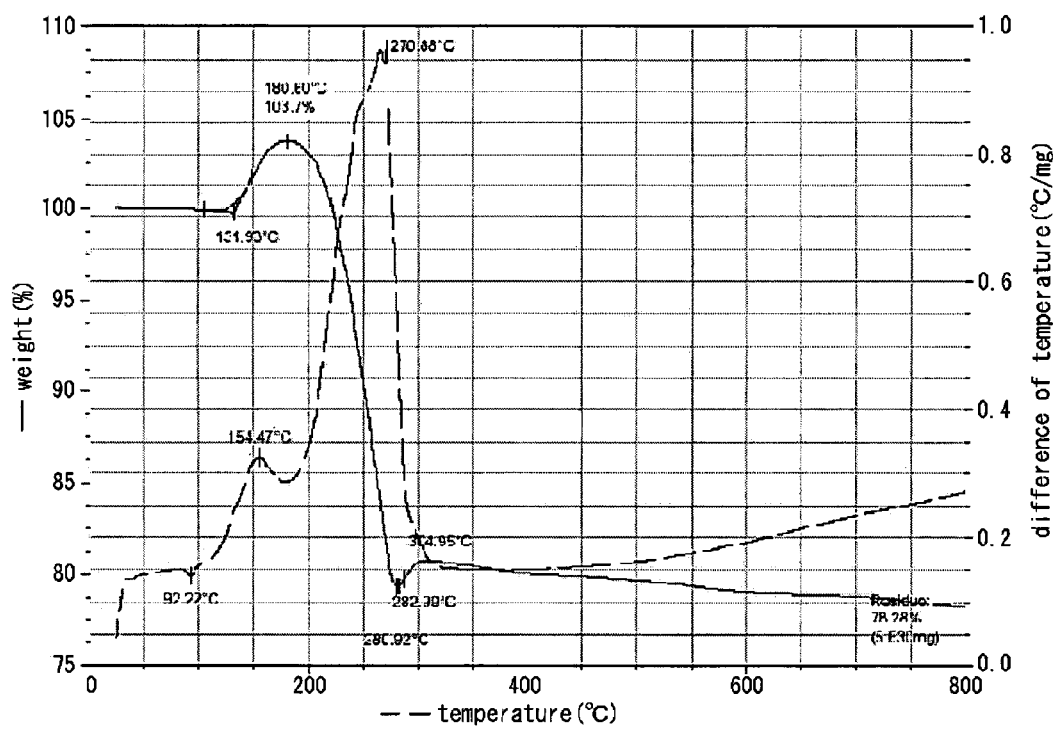
FIG. 6 is graphs that represent the results of DSC and TGA for the metal nanoparticles produced according to an embodiment of the invention.

FIG. 5 is a X-ray diffraction (XRD) result of metal nanoparticles produced according to an embodiment of the invention. Referring to FIG. 5, as shown in the XRD data which was obtained after exposing the metal nanoparticles of the invention to the air at room temperature, it is shown that the copper included in the metal nanoparticles remains as pure copper that is not oxidized. The result graph exactly coincide with Card No. 4-0836(pure copper), Card No. 4-0783(pure silver) of Joint Committee for Diffraction Standards(JCPDS). FIG. 6 is a graph of DSC and TGA result of metal nanoparticles produced according an embodiment of the invention. Referring to FIG. 6, it is shown that the Ag thin layer prevents copper core from oxidation up to 131° C., when the metal nanoparticles are heated up to 800° C.

General descriptions about nanoparticles and producing method were given above, hereinafter more detailed producing method of nanoparticles of the invention according to embodiments will be given.

EXAMPLE 1

Oleylamine 100 g, copper acetylacetonate($C_5H_7CuO_2$) 7 g and ascorbic acid 5 g were put into a round flask equipped with a condenser and heated to 70° C. for 1 hour. After then, the temperature was raised to 250° C. by a rate of 5° C./min, and the reaction solution was reacted for 30 min at 250° C. After the reaction solution was cooled to 150° C. by air-cooling, 2 g of Ag dodecanate was added and then the temperature was raised to 250° C. by a rate of 5° C./min, and the reaction solution was reacted for 30 min at 230° C. After the reaction completed, 300 ml of methanol was added and the nanoparticles were precipitated. These precipitates were washed with methanol more than 3 times and dried at 45° C. in a drying oven.

Figure 4:
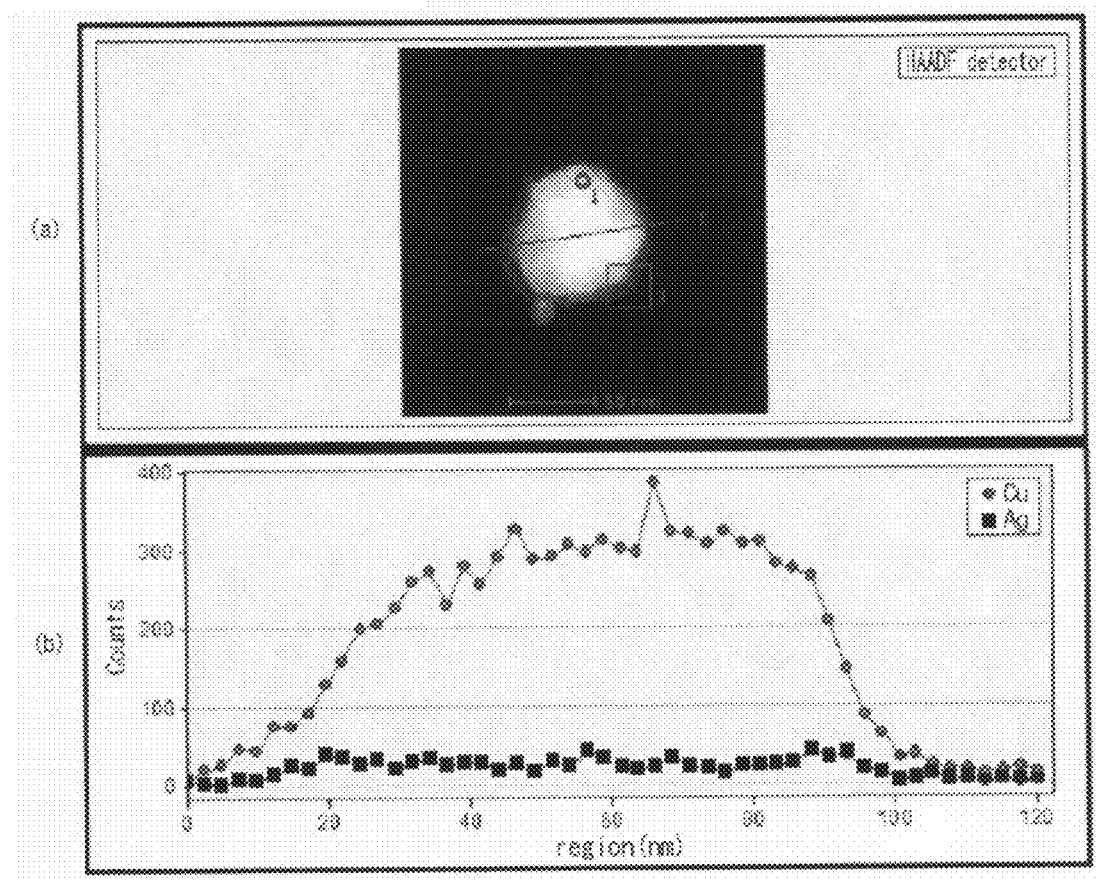
FIG. 4 is a TEM image and a graph representing regional contents of the metal nanoparticles produced according to an embodiment of the invention.

FIG. 2 is a SEM photo of the metal nanoparticles produced according to this procedure, FIG. 3 is particle distribution of the metal nanoparticles produced according to example 1, FIG. 4 is also a TEM photo of the metal nanoparticles produced according to example 1. Further, FIG. 5 and FIG. 6 are also the results representing oxidation manner of the metal nanoparticles produced according to example 1.

EXAMPLE 2

Oleylamine 50 g, 1-octadecene 50 g, copper acetylacetonate($C_5H_7CuO_2$) 20 g and ascorbic acid 15 g were put into a round flask equipped with a condenser and heated to 70° C. for 1 hour. After then, the temperature was raised to 110° C. by a rate of 5° C./min, and the reaction solution was reacted for 1 hour. After the solution was cooled to 50° C. by air-cooling, 7 g of Ag dodecanate was added and then the temperature was raised to 110° C. by a rate of 5° C./min, and the reaction solution was reated for 1 hour at 110° C. After the reaction completed, 300 ml of methanol was added and the nanoparticles were precipitated. These precipitates were washed with methanol more than 3 times and dried at 45° C. in a drying oven.

EXAMPLE 3

Oleylamine 50 g, xylene 50 g, copper acetylacetonate ($C_5H_7CuO_2$) 20 g and ascorbic acid 15 g were put into a round flask equipped with a condenser and heated to 70° C. for 1 hour. After then, the temperature was raised to 250° C. by a rate of 5° C./min, and the reaction solution was reacted for 30 min at 250° C. After the reaction solution was cooled to 50° C. by air-cooling, 7 g of Ag dodecanate was added and then the temperature was raised to 250° C. by a rate of 5° C./min, and the reaction solution was reacted for 30 min at 250° C. After the reaction completed, 300 ml of methanol was added and the nanoparticles were precipitated. These nanopricipitates were washed with methanol more than 3 times and dried at 45° C. in a drying oven.

EXAMPLE 4

Oleylamine 50 g, 1-hexadecene 50 g, copper acetylacetonate($C_5H_7CuO_2$) 20 g and ascorbic acid 15 g were put into a round flask equipped with a condenser and heated to 70° C. for 1 hour. After then, the temperature was raised to 200° C. by a rate of 5° C./min, and the reaction solution was reacted for 30 min. After the solution was cooled to 100° C. by air-cooling, 7 g of Ag dodecanate was added and then the temperature was raised to 200° C. by a rate of 5° C./min, and the reaction solution was reacted for 30 min. After the reaction completed, 300 ml of methanol was added and the nanoparticles were precipitated. These nanopricipitates were washed with methanol more than 3 times and dried at 45° C. in a drying oven.

Production of Conductive Ink 100 g of core-shell structure nanoparticles having 50 to 100 nm in size, each produced by examples 1 to 4, was added to an aqueous solution of diethylene glycol butyl ether acetate and ethanol, and then dispersed with an ultra-sonicator to produce conductive ink of 20 cps. The conductive ink thus produced was printed on a circuit board to form conductive wirings by inkjet techniques.

It is also apparent that the present invention is not limited to the examples set forth above and more changes may be made by those skilled in the art without departing from the principles and spirit of the present invention.

What is claimed is:

1. A method of producing metal nanoparticles, the method comprising:
    forming copper nanoparticles from a copper precursor by using a reducing agent under a solvent including a primary amine; and
    forming a metal thin layer having high reduction potential on the surface of the copper nanoparticles, with a metal precursor which has higher reduction potential than copper.

2. The method of claim 1, the method comprising:
    mixing the copper precursor and the reducing agent uniformly in the solvent including the primary amine;
    forming copper core particles by heating the mixture up to the boiling temperature of the solvent or lower;
    cooling the mixture to room temperature or below the heated temperature;
    adding a metal alkanoate which has higher reduction potential than the copper; and
    forming the metal thin layer having high reduction potential on the surface of the copper core particles, by heating the mixture up to the boiling temperature of the solvent or lower.

3. The method of claim 2, wherein the metal alkanoate having higher reduction potential is one or more compounds selected from the group consisting of dodecanate, oleate, hexadecanoate, tetradecanoate, palmitate and stearate of silver, palladium, platinum, gold and alloys thereof.

4. The method of claim 2, wherein the metal alkanoate having higher reduction potential is added so that the metal ions supplied by the metal alkanoate become 0.01-1 equivalent of the copper ions supplied by the copper precursor.

5. The method of claim 2, wherein the mixture at the step of mixing the copper precursor and the reducing agent is mixted uniformly at 50-80° C. for 30 minutes to 2 hours.

6. The method of claim 2, wherein the temperature of the mixture at the step of forming copper core particles or at the step of forming the metal thin layer is raised at a constant rate up to the boiling temperature of the solvent or lower.

7. The method of claim 6, wherein the temperature is in the range of from 100 to 320° C.

8. The method of claim 6, wherein the contant rate is 1-10° C./min.

9. The method of claim 6, wherein the mixture at the step of forming copper core particles and at the step of forming the metal thin layer is reacted at a temperature of 130-230° C. for 30 minutes to 2 hours.

10. The method of claim 2, wherein the mixture at the step of cooling the mixture is cooled to 70% of the heated temperature or lower.

11. The method of claim 10, wherein the mixture at the step of cooling the mixture is cooled to a temperature of 18-175° C.

12. The method of claim 2, the method further comprising:
    precipitating the mixture including the metal nanoparticles with an organic solvent after the step of forming the metal thin layer having high reduction potential on the surface of the copper core particles; and
    washing the precipitated nanoparticles with the organic solvent and drying.

13. The method of claim 1, wherein the primary amine is one or more compounds selected from the group consisting of propylamine, butylamine, octylamine, decylamine, dodecylamine, hexadecylamine and oleylamine.

14. The method of claim 1, wherein the solvent further includes a hydrocarbon-based compound.

15. The method of claim 14, wherein the hydrocarbon-based compound is added by 50-200 parts by weight with respect to 100 parts by weight of the primary amine.

16. The method of claim 14, wherein the hydrocarbon-based compound is one or more compounds selected from the group consisting of octane, decane, tetradecane, hexadecane, toluene, xylene, 1-octadecene and 1-hexadecene.

17. The method of claim 1, wherein the reducing agent is one or more compounds selected from the group consisting of tert-butylhydroxy toluene, tert-butylhydroxyanisol, α-tocopherol, ascorbic acid, carotenoid, flabonoid and tannin.

18. The method of claim 1, wherein the reducing agent is added by 1-20 parts by weight with respect to 100 parts by weight of the solvent.

19. The method of claim 1, wherein the copper precursor is one or more compounds selected from the group consisting of $Cu(NO_3)_2$, $CuCl_2$, $Cu(HCOO)_2$, $Cu(CH_3COO)_2$, $Cu(CH_3CH_2COO)_2$, $CuCO_3$, $CuSO_4$ and $C_5H_7CuO_2$.

20. The method of claim 1, wherein the copper precursor is added by 1-15 parts by weight with respect to 100 parts by weight of the solvent.

21. The method of claim 1, wherein the metal having higher reduction potential than copper is one or more metals selected from the group consisting of silver, palladium, platinum, gold and alloys thereof.

22. The method of claim 21, wherein the metal having higher reduction potential than copper is silver.

* * * * *

UNITED STATES PATENT AND TRADEMARK OFFICE
CERTIFICATE OF CORRECTION

PATENT NO. : 7,611,644 B2
APPLICATION NO. : 11/709242
DATED : November 3, 2009
INVENTOR(S) : In-Keun Shim et al.

Page 1 of 1

It is certified that error appears in the above-identified patent and that said Letters Patent is hereby corrected as shown below:

Title Page, Column 2 (Other Publications), Line 3, change "Cu0Ag" to --Cu-Ag--.

Title Page, Column 2 (Other Publications), Line 4, change "Norganic" to --Inorganic--.

Column 9, Line 58, change "mixted" to --mixed--.

Column 10, Line 7, change "contant" to --constant--.

Signed and Sealed this

Ninth Day of February, 2010

David J. Kappos
*Director of the United States Patent and Trademark Office*